United States Patent [19]
Nguyen et al.

[11] Patent Number: 5,543,022
[45] Date of Patent: Aug. 6, 1996

[54] DISC-HANDLING APPARATUS

[75] Inventors: Hoang Nguyen; Bruce M. Harper, both of San Jose, Calif.

[73] Assignee: HMT Technology Corporation, Fremont, Calif.

[21] Appl. No.: 372,990

[22] Filed: Jan. 17, 1995

[51] Int. Cl.[6] ............................. C23C 14/50; B65H 1/00
[52] U.S. Cl. ............................. 204/298.15; 204/298.11; 204/298.23; 204/298.25; 414/222; 414/225; 414/217; 414/729; 414/731; 118/728; 118/729
[58] Field of Search ............................. 204/298.11, 298.15, 204/298.23, 298.25, 298.26; 118/728, 729, 719, 500, 503, 504; 414/222, 225, 226, 941, 217, 738, 739, 741, 731, 729; 198/803.3, 803.8, 803.9, 860.3, 470.1

[56] References Cited

U.S. PATENT DOCUMENTS

| | | | |
|---|---|---|---|
| 4,892,451 | 1/1990 | Mahler | 414/217 |
| 4,936,329 | 6/1990 | Michael et al. | 414/225 |
| 4,981,408 | 1/1991 | Hughes et al. | 414/222 |
| 5,205,919 | 4/1993 | Zejda | 204/298.15 |
| 5,215,420 | 6/1993 | Hughes et al. | 204/298.25 |
| 5,259,603 | 11/1993 | Geisler et al. | 269/43 |

*Primary Examiner*—R. Bruce Breneman
*Assistant Examiner*—Rodney G. McDonald
*Attorney, Agent, or Firm*—Peter J. Dehlinger; Judy M. Mohr

[57] ABSTRACT

A disc-handling apparatus for supporting a magnetic disc during material deposition and for transporting the disc into and out of a deposition station is described. The apparatus has a holder that supports a disc at three contact points by a support and a pair of arms, such that the disc is positively gripped by at least three contact points.

19 Claims, 6 Drawing Sheets

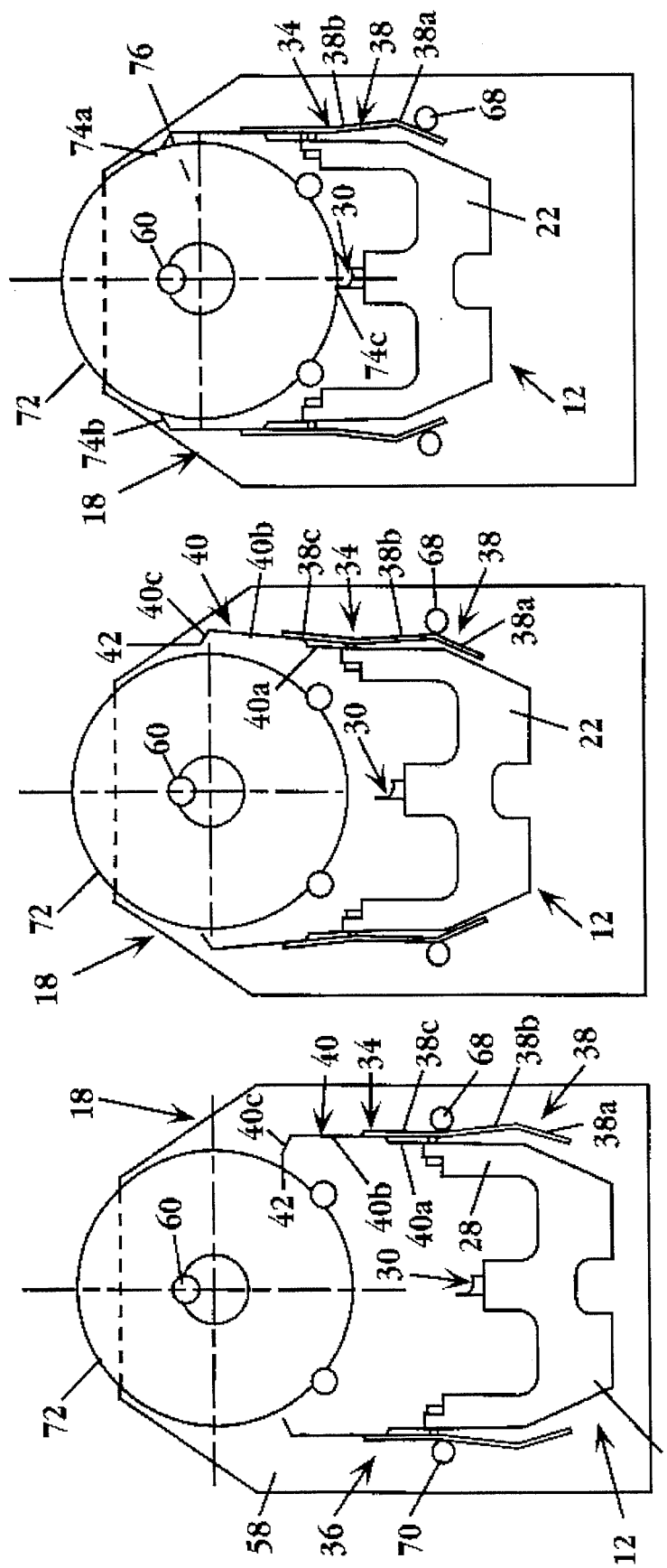

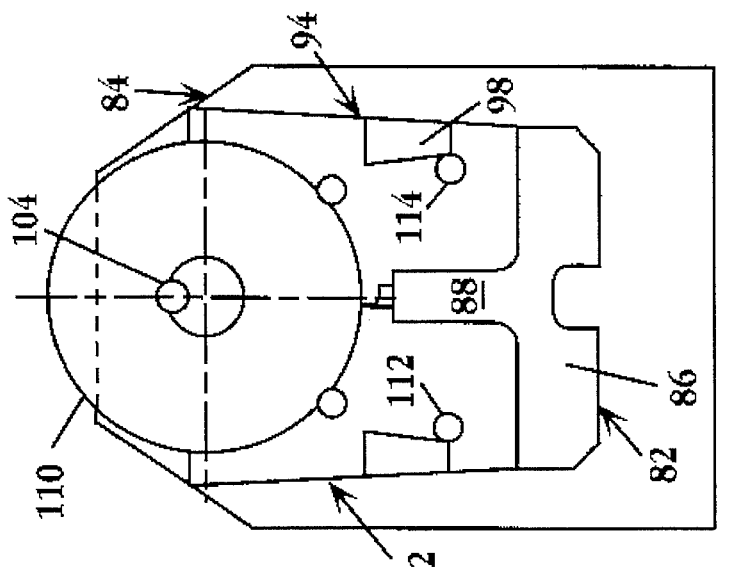
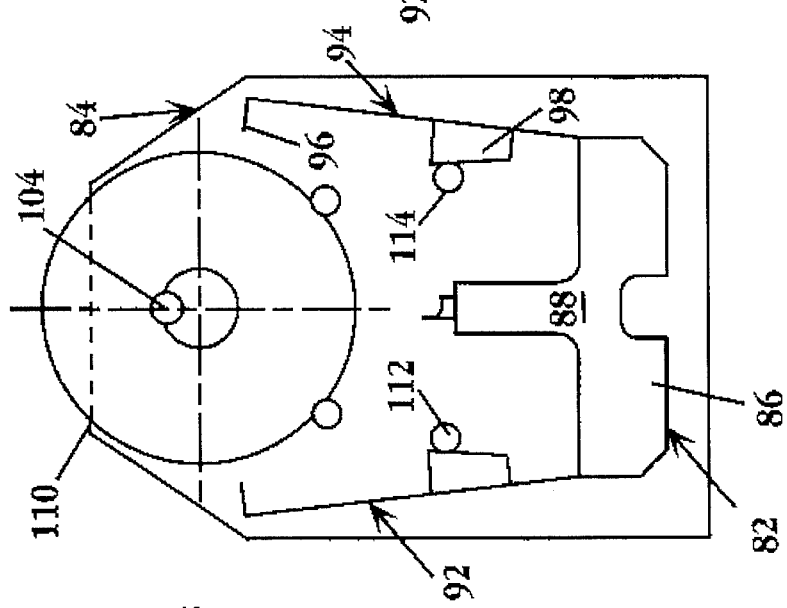
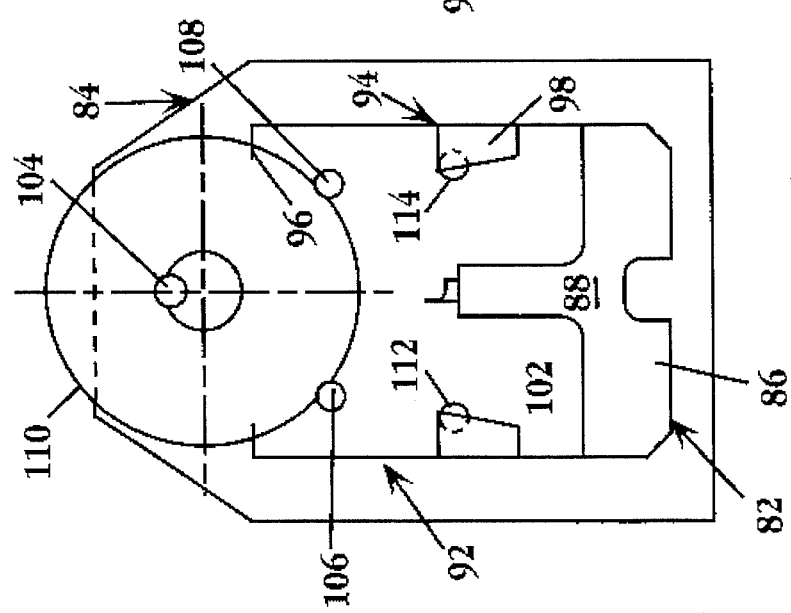

5,543,022

DISC-HANDLING APPARATUS

FIELD OF THE INVENTION

The present invention relates to a disc-handling apparatus for supporting a disc during sputter deposition, and for transporting the disc into and out of a sputtering station within a vacuum chamber environment.

BACKGROUND OF THE INVENTION

Rigid magnetic recording media are used for recording and retrieving digital data in computer disc drive devices. During fabrication of thin-film magnetic recording discs, hereinafter magnetic discs or discs, there are two important handling requirements that must be met in fabricating high quality discs. First, the work area must be free of contaminants, such as dust and other air-borne particles; second, the discs must be protected from physical damage that may occur as the discs are being handled.

A disc, after loading into a sputtering apparatus, travels through a series of sputtering chambers, or deposition stations, for deposition of successive layers onto the disc. In one type of sputtering apparatus, the disc is transferred from one sputtering station to another by means of a walking beam arrangement. The disc is balanced in a holder having a series of V-shaped receivers, typically three, that are arranged to receive and support the disc in a vertical position between opposing sputtering targets, for layer deposition on opposite sides of the disc. The V-shaped receivers must be deep enough to provide stable disc seating, and wide enough to present a substantial landing zone for the disc, as the disc is transferred in and out of the holder.

The groove width and depth of such V-shaped receivers is typically between 90°–130°, and while less obtuse angles provide greater stability, the V-shaped receiver masks a portion of the disc. The masking produces disc shadowing effects in the outer tracks of the disc, reducing the effective bit storage space on the disc. There are also problems with discs tending to fall out of the V-shaped receivers or to vibrate during transport, creating damage to the edge of the disc. Further, when a bias is applied to the disc during sputtering, by applying a voltage to the holder, accumulation of material in the V-groove can become a secondary target source of deposition onto the disc in the outer track region, creating anomalies in the disc's surface.

It would be desirable, therefore, to provide for use in a sputtering system, a support and transport apparatus designed to stably hold a disc during sputtering, while reducing shadowing effects and therefore, increasing the effective storage space on the disc and generally improve disc transport stability.

SUMMARY OF THE INVENTION

The invention includes a disc-handling apparatus for use in supporting a disc during material deposition on the disc at a deposition station, and for transporting the disc into and out of the deposition station.

A disc holder in the apparatus functions to hold the disc in a selected deposition plane, preferably an upright plane, during material deposition, by engaging the disc with (i) a support having a support edge that contacts a first point on the disc's outer rim, and (ii) a pair of arms defining confronting gripping edges that contact second and third points on opposed side regions of the disc's outer rim, such that the disc is positively gripped by the three edges.

A disc-transport carriage in the apparatus is designed to support a disc on the carriage. The carriage is mounted for relative movement with respect to the holder in one direction, toward and away from a disc-transfer site, and the holder is mounted for relative movement with respect to the carriage in another direction, toward and away from a resting position.

Also included is a structure designed to move the holder arms toward a gripping condition, at which the arms are effective to contact and apply radially inward forces on opposite side regions of the disc, as the holder is moved away from its resting position with the carriage positioned at its transfer site. Further movement of the holder away from the resting position is effective to disengage the disc from the carriage.

In one preferred embodiment, the points of contact of the holder's support and contact edges with a disc form a triangle that encompasses the center point of the disc.

Also in a preferred holder embodiment, the arms are under tension in their gripping condition, and the tension is effective to apply radially inward forces on a disc, holding the disc in a captured condition.

The apparatus is preferably designed for use with a disc of the type having a chamfered annular outer edge region. Here the holder edges are each formed of at least one groove, this groove being dimensioned to receive and support a section of the disc edge region within the groove, with adjacent non-chamfered regions of the disc disposed outside the groove. The support and gripping edges may each be formed of a single, substantially V-shaped groove, with an interior angle of greater than about 125°. Alternatively, the support and gripping edges may be substantially flat, serrated edges, each formed of a plurality of side-by-side grooves. Each groove in the serration is dimensioned to receive and support a section of such disc edge region within the groove, with adjacent non-chamfered regions of the disc disposed outside the groove.

Each of the arms in the holder may be composed of an electrically conductive lower cam member and an electrically conductive upper contact member. In one of these arms, the contact member is attached to the cam member by an insulative sleeve. This arm may further include shielding structure for preventing sputtered material from forming a continuous sputtered-material electrical connection between the two members. Where it is desired to apply a bias to a supported disc during sputtering, one of the edges may be electrically connected to the pedestal, with the other two being electrically insulated therefrom.

The structure for moving the holder arms from their open condition toward their gripping condition preferably includes a pair of pins on the carriage, hereinafter carriage pins, for engaging corresponding holder arms, and surface structures, such as cam surfaces on the holder arms, in contact with the carriage pins, such that the arms are moved toward or away from their gripping condition in response to relative movement of the holder and carriage away from and toward the holder's resting position, respectively.

In one embodiment, the carriage pins are designed to move the arms from a relaxed to an open condition, when the carriage is moved to its disc-transfer site, with the holder in its resting position, and to move the arms toward their gripping condition as the holder is moved away from its resting position.

In another embodiment, the carriage pins are designed, with the carriage in its disc-transfer site and the holder in its resting position, to move the arms from a relaxed condition to an open condition, then from the open to the gripping condition, as the holder is moved progressively away from its resting condition.

Where the apparatus is designed to support a disc in a substantially upright position during material deposition, the carriage is preferably movable in a substantially horizontal direction toward and away from the disc-transfer site, and the holder is preferably movable in a substantially vertical direction toward and away from its resting position.

In another aspect the invention includes a disc holder of the type described above, for supporting a planar disc of the type having a chamfered annular outer edge region, in a selected deposition plane, during material deposition on the disc. The holder includes a pedestal, and carried thereon, a support and a pair of contact arms, where at least one of the arms is movable to allow three-point contact between three holder edges and each of a group of discs whose outer diameters are within a defined diameter tolerance. The support and contact arms provide contact edges each formed of at least one groove, where the groove is dimensioned to receive and support a section of such disc edge portion within the groove, with adjacent non-chamfered regions of the disc disposed outside the groove.

In various embodiments, the holder has the edge configurations, arm biasing and arm construction described above.

These and other objects and features of the invention will be more fully appreciated when the following detailed description of the invention is read in conjunction with the accompanying drawings.

BRIEF DESCRIPTION OF THE DRAWINGS

FIGS. 4A–4C illustrate steps in the transfer of a disc from the disc-transport carriage to the disc holder in the FIG. 1 apparatus;

FIGS. 6A–6C illustrate steps in the transfer of a disc from the disc-transport carriage to the disc holder in the FIG. 5 apparatus, but shown in a simplified construction.

DETAILED DESCRIPTION OF THE INVENTION

The present invention is designed for transporting a disc into and out of a sputtering station, and typically into and out of a series of sputtering stations, as the disc is moved serially in a sputtering apparatus for deposition of successive layers on the disc surface.

In each sputtering station, the disc is supported during sputtering by a disc holder which holds the disc in a preferably vertical position between opposed sputtering targets, for depositing a layer on opposite disc surfaces. Following deposition in that chamber, the disc is transferred to a carriage in the apparatus, for disc movement to the next sputtering station, and transferred to the disc holder in that station.

Figure 1:
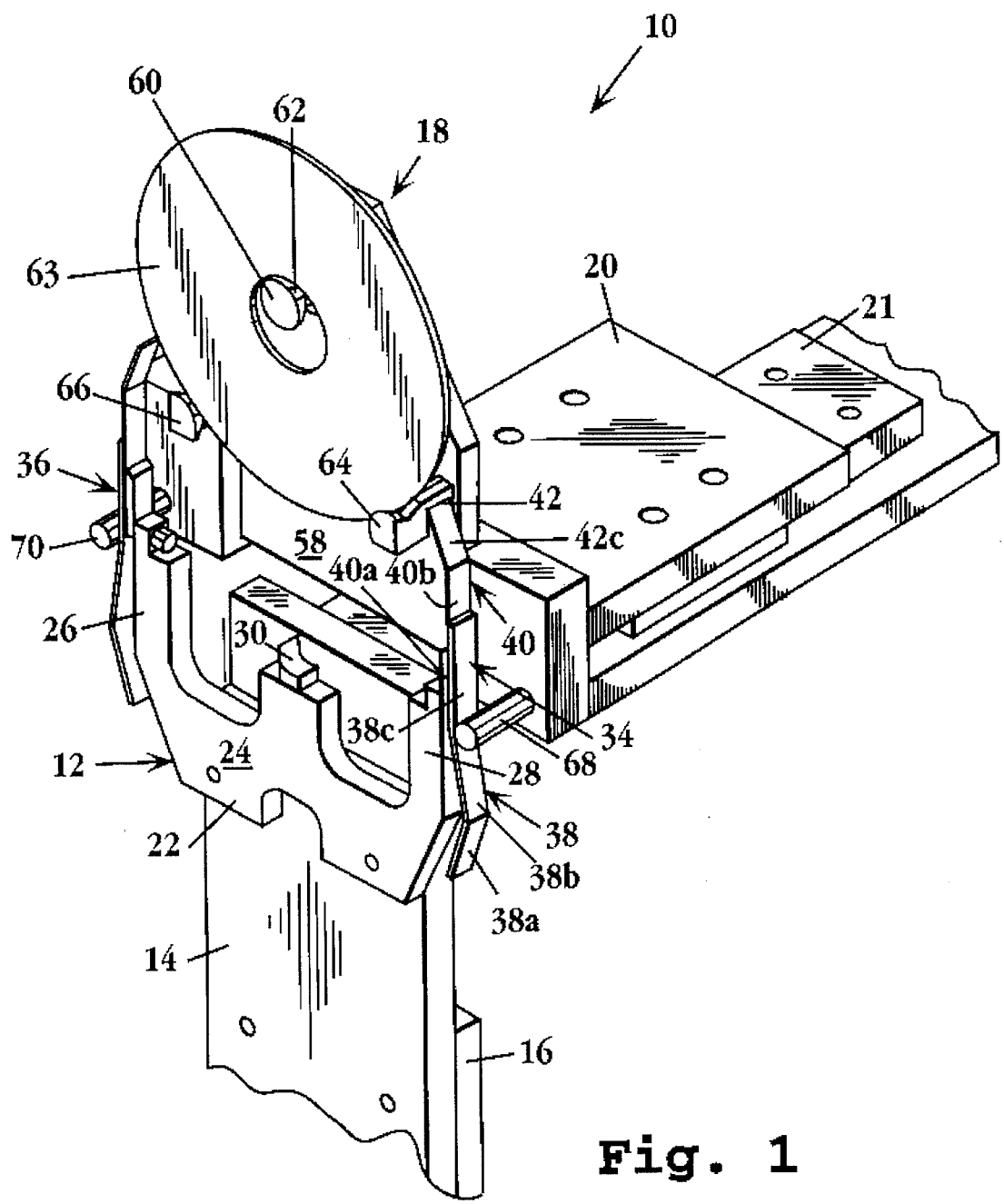
FIG. 1 shows a disc-handling apparatus constructed in accordance with one embodiment of the invention, showing a disc supported on a disc-transport carriage in the apparatus.

FIG. 1 shows one embodiment of a disc-handling apparatus 10, constructed in accordance with the invention. The disc holder in the apparatus, indicated at 12, is mounted through a support 14 in the holder for movement along a track 16 in a vertical direction between a resting position (shown) and a sputtering position (not shown) at which a disc supported on the holder is positioned in a sputtering station for layer deposition on the disc surfaces, conventionally.

The carriage in the apparatus, indicated at 18, is mounted, through a block 20 in the carriage, for movement along a track 21 in a horizontal direction between adjacent sputtering stations, and in particular, toward and away from a disc-transfer site in each station, as will be discussed below.

Disc holder 12 includes a wing-shaped pedestal 22 attached to support 14. The pedestal has a center post 24 and a pair of side posts 26, 28. A support 30 carried on the center post has the construction described below.

A pair of arms 34, 36 are attached to side posts 26, 28, respectively. Arm 34, which is representative, includes a cam member 38 and a contact member 40 carried on the cam member. Cam member 38 has a V-shaped cam surface with first and second cam segments 38a, 38b, respectively, and an upper segment 38c, through which cam member 38 is attached to the associated contact member. The cam member is formed of a relatively stiff, i.e., rigid, material, such as a rigid metal bar.

Contact member 40, which is representative, is rigidly attached at a lower end segment 40a to the associated post, such as post 28, as seen best in FIG. 4A. With continued reference to this figure, the contact member includes a center segment 40b to which the cam member is rigidly attached, as by welding, and an upper contact segment 40c which is bent inwardly as shown. The contact member terminates at its upper end in a gripping edge 42 which has the features of the support edge, described below with respect to FIGS. 2 or 3. The contact members are formed of flexible ribbon material, such as spring steel ribbon, for providing spring biasing in gripping a disc, as will be described below.

The two holder arms are relatively moveable toward and away from one another between a relaxed condition, shown FIG. 4A, and an open condition, at which the arms' confronting gripping edges are spaced from one another by a distance greater than the diameter of the disc's outer rim, permitting a disc to be received between the two arms, as seen in FIG. 4B. As the arms are moved from their open toward their relaxed condition, with a disc positioned between the arms, the arm gripping edges make contact with opposed edge regions of disc. The spring bias of the arms acts to apply inward radial forces on the contacted edge regions of the disc, holding the disc in a captured position. This latter arm condition, at which the arm edges are in contact with the disc and in a bent condition so as to apply gripping forces on the disc is also referred to herein as a gripping condition.

As noted above with reference to FIG. 1, the disc holder is mounted on track 16 for vertical movement between a lower resting position and an upper sputtering position. Track 16, which forms part of the apparatus, is mounted in one of the sputtering chambers in a sputtering apparatus, and extends between these two positions. Support 14 in the disc holder is slidably mounted on the track, e.g., by a conventional ball bearing track mounting. The track and structure slidably mounting the disc holder on the track are also referred to herein, collectively, as means mounting the holder for relative movement with respect to the carriage in one direction toward and away from the resting position. Also included in the apparatus, but not shown here, are suitable drive means for moving the disc holder along track 16 to selected holder positions.

Figure 2:
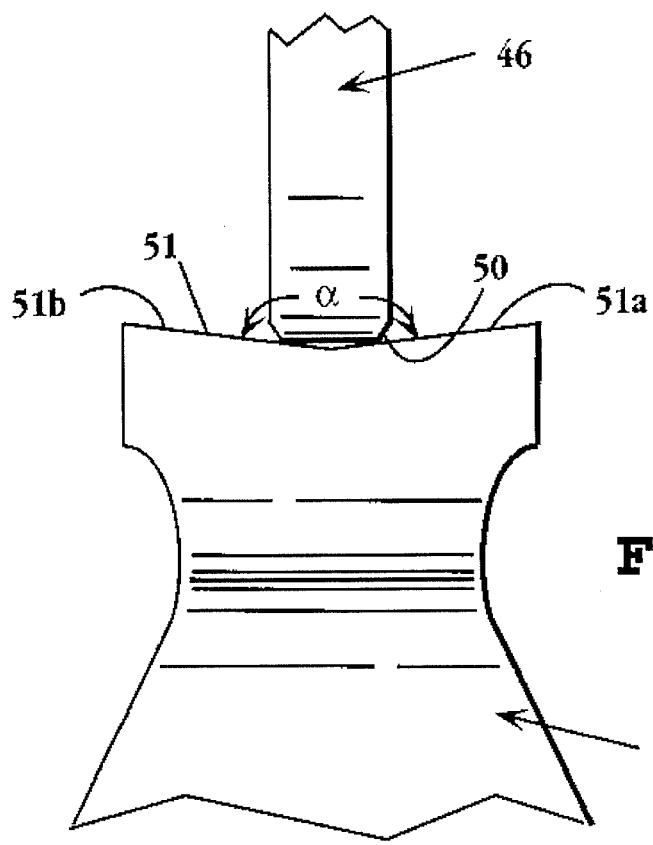
FIG. 2 shows in side view, a fragmentary portion of a support edge in a disc holder in the FIG. 1 apparatus, in contact with a lower region of a disc.

FIG. 2 shows an enlarged fragmentary portion of support 30 in the apparatus shown in FIG. 1, and a lower portion of a disc 46 supported thereby. The disc, seen in side view, has a chamfered annular outer edge region, a portion of which is shown at 50. The edge in support 30 is formed by a shallow V-shaped groove 51, whose sides 51a and 51b define an interior angle α. According to an important feature of this embodiment of the invention, the interior angle of the groove is quite shallow, typically greater than about 125°, and preferably between about 160°–180°, i.e., a substantially flat edge.

This feature, which is made possible by the biasing of the support arms, as described below, substantially eliminates problems of shadowing of deposited material in the outer track regions of the disc, by placing the planar outer regions of the disc above a shadow line defined by the outer tips of the support edge (This feature will also be appreciated below with reference to FIGS. 3A and 3B). At the same time, the wide side-to-side landing zone formed by the edge allows seating the disc to ensure contact, and a disc that lands anywhere along the support edge is guided to the bottom of the groove.

It will be appreciated that the gripping edges on the contact arms in the apparatus have substantially the same construction as edge 51 in the embodiment being discussed.

Figures 3A, 3B:
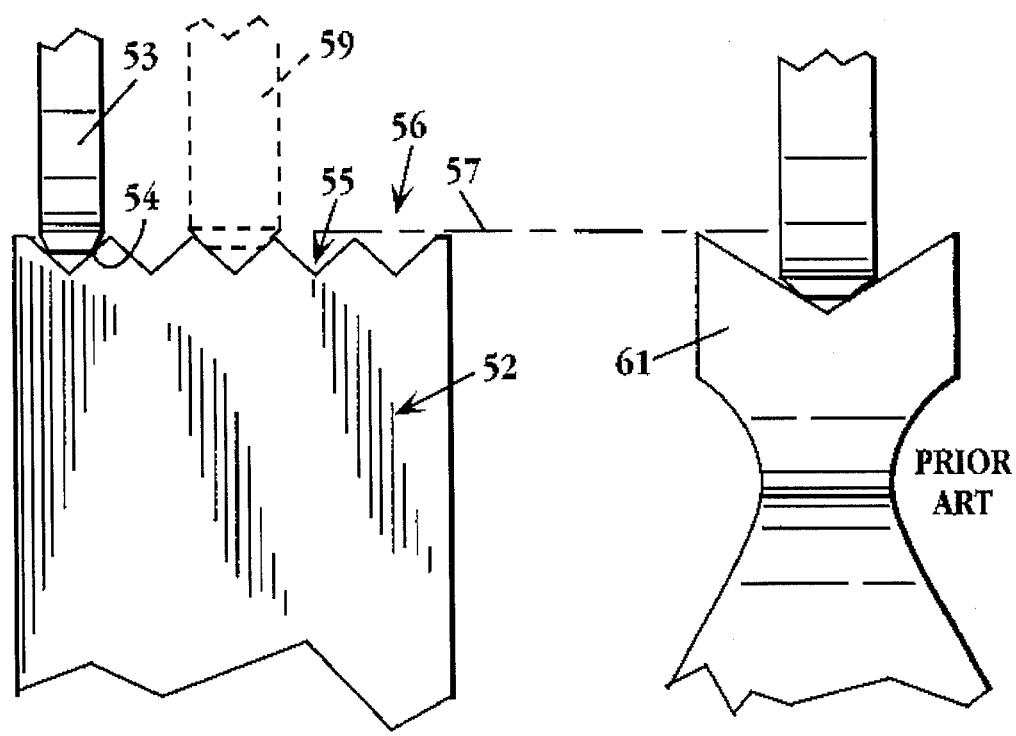
FIG. 3A shows a similar view of a serrated edge in a holder constructed in accordance with another embodiment of the invention, illustrating the relationship between a chamfered edge region of a disc supported in one of the grooves in the serrated edge and a sputtering shadow line (dashed line)
FIG. 3B shows in side view, a steeply grooved edge in a disc holder constructed in accordance with the prior art, also illustrating the relationship between the chamfered edge region of a disc supported in the groove and a sputtering shadow line.

FIG. 3A is a similar side view of the edge region of a support 52 in an apparatus according to another embodiment of the invention, and a lower portion of a disc 53 supported thereby. As above, the disc has a chamfered annular outer edge region, a portion of which is shown at 54. The edge in support 52 is formed by a series of side-by-side grooves, such as groove 55, which collectively form a serrated edge, indicated at 56. The dashed line in the figure, indicated at 57 and corresponding to the peaks of the edge serration, defines a sputtering shadow line, that is, the line below which deposition of material onto the disc will be adversely affected by the edge serrations. According to an important aspect of this embodiment of the invention, each groove forming the serrated edge has a peak-to-peak distance and groove angle which function to receive and support the disc's edge region in the groove, with the adjacent planar regions of the disc disposed above the sputtering shadow line. Typically, the grooves have a peak-to-peak distance slightly greater than the width of the supported disc, and an internal groove angle of about 90°.

The figure also shows, in dotted lines, a lower portion of a disc 59 having a width which is slightly greater than the peak-to-peak distance between the grooves forming the serrated edge in the support, illustrating how the serrated-edge grooves can accommodate a variety of different-width discs, whose diameters are within a defined diameter-tolerance, each supported with the planar side regions supported above the sputtering shadow line.

A support constructed as described to have a substantially flat, serrated edge provides a wide landing zone for seating a disc, to properly seat the disc edge in a groove regardless of where the disc first contacts the serrated edge. The disc is securely seated in a groove on the support edge, with the spring bias of the arms acting to help guide the disc to a groove for seating in the bottom of the groove.

It will be appreciated that the gripping edges on the contact arms in the apparatus may have substantially the same construction as edge 56 in the embodiment just discussed.

For comparative purposes, FIG. 3B shows a deep-groove support edge 61 of the type found on prior-art disc-support devices. As seen, the groove places portions of the planar surface region of the disc well below the sputtering shadow line, leading to inhomogeneous sputter deposition at the outer edge region of the disc.

With reference again to FIG. 2, it can be appreciated that the shallow groove formed in edge 51 may also be designed and dimensioned to support a disc with its planar deposition surface at or above a sputtering shadow line.

The serrated gripping edge provides a secure seat for the disc, and the shallow angle of the support edge provides a substantial landing zone or seating area for the disc. The gripping edges in this embodiment of the apparatus may be similarly formed.

With reference again to FIG. 1, disc-transport carriage 18 includes a front plate 58 which is vertically disposed and attached to base 20 for movement with the base along track 21 between sputtering chambers.

Mounted on the front plate is a support button 60 having a beveled annular surface 62 designed to support a disc 63 at its inner edge on the carriage, as shown. A pair of similar beveled support buttons 64, 66, mounted on the front wall act to support outer edge regions of disc 63, with the disc mounted on button 60, and stabilize the disc against movement out of a vertical plane. Button 60 is also referred to herein a supporting means, and buttons 64, 66, as stabilizing members.

As noted above, the carriage is mounted on track 21 for horizontal shifting between a disc-transfer site in one chamber, where the carriage is positioned for disc transfer to an associated disc holder, and a disc-transfer site in a second sputtering chamber in a sputtering apparatus, or an onload or offload station in the apparatus. Track 21, which forms part of the apparatus, is mounted to extend between adjacent sputtering chambers, or between a sputtering chamber and an onload or offload site in a sputtering apparatus. Carriage 18 in the disc holder is slidably mounted on the track, e.g., by a conventional ball bearing track mounting, as above. The track and structure slidably mounting the carriage on the track are also referred to herein, collectively, as means mounting the carriage for relative movement toward and away from a disc-transfer site. Also included in the apparatus, but not shown here, are suitable drive means for moving the carriage along track 16 to selected carriage positions.

Completing the description of what is shown in FIG. 1, the carriage includes a pair of pins 68, 70, for moving the arms toward and away from their relaxed condition, when the carriage is in its disc-transfer position, and the disc holder is moved vertically with respect to the carriage.

Operation of the apparatus is illustrated in FIGS. 4A–4C, showing the steps in the transfer of a disc from the disc-transport carriage to the disc holder described in FIG. 1. The figures show, in front-on view, the portion of disc-holder 12, including pedestal 22, support 30, and arms 34, 36, designed for supporting a disc in a gripped condition, and a portion of carriage 18, including front plate 58, support button 60, and pins 68, 70. Also shown is a disc 72 carried on the carriage, for transfer to the disc holder. In this embodiment, both the disc carriage and the disc holder have their disc-supporting features in the same plane, i.e., the disc transfer occurs in a single vertical plane.

FIG. 4A shows the disc holder in its resting position, and the carriage in its disc-transfer position, corresponding to the relative positions of the disc holder and carriage in FIG. 1. At this position, pins 68, 70 in the carriage are positioned immediately above the two lower arm segments in each disc-holder arm.

As the disc-holder is moved upwardly, the two carriage pins, acting against the upper segments in the arms' cam surfaces, such as segments 38b and 38c, act to pivot the arms inwardly at the bottom and outwardly at the top to an open condition, as shown in FIG. 4B. In this condition, the disc on carriage 18 can be received between the two gripping edges of the arms, as shown.

Finally, with still further upward movement of the holder, and with the carriage still in its disc-transfer position, the action of pins 68, 70 on the lower segments of the arms' cam surfaces causes the arms to pivot in the opposite direction, toward the relaxed arm condition, shown in FIG. 4A. As this occurs, the arms' gripping edges make initial contact with outer edge regions of the disc, on opposite sides of the disc, as shown in FIG. 4C. At about the same time, support 30 engages the disc at a lower edge surface.

With further upward movement of the holder, pins 68, 70 disengage the lower ends of the holder arms, and the arms are free to assume their relaxed condition, but for the contact of the arm edges with the outer disc edges. This constraint results in an inward bending of the arms which acts to apply inward substantially radial forces against opposite side regions of the disc, to grip the disc at these two contact points.

As can be appreciated, pins 68, 70 on carriage 18, and the cam surfaces formed by cam members, such as member 38 on the holder arms, function as means for moving the arms toward their relaxed condition, as the holder is moved away from its resting position.

As seen in FIG. 4C, the three points of contact of the holder edges with the disc, indicated at 74a, 74b, 74c, form a triangle 74a, 74b, 74c which includes the center point of the disc, indicated at 76. With a disc supported on one or more lower support edges, the two gripping edges are effective to contact and apply radially inward forces on opposite outer edge regions of the disc, to grip the disc securely as it is moved into and out of the associated sputtering station during a sputtering operation. In particular, the disc is securely gripped even though the contact edges have very shallow grooves or are flat edges.

Completing the description of a disc-transfer operation, continued upward movement of the holder, with the carriage still in its disc-transfer position, lifts the disc off of support button 60 in the carriage, allowing the carriage to be retracted, and then the holder with its gripped disc to be raised to a sputtering position in the sputtering chamber.

After the sputtering step, the holder is lowered to a position near its resting position at which the same carriage can now be positioned again at its disc-transfer position, with the carriage's support button received within the inner opening of the disc.

As the holder is then lowered further, pins 68, 70 engage the cam surfaces of the arm, to open the arms and allow release of the disc onto the carriage support buttons, as the holder is moved to its resting condition. The carriage, with the sputtered disc, can now be transported to another sputtering station for further processing.

The disc holder just described forms one aspect of the invention. More generally, in this aspect, the holder is designed for supporting a planar disc of the type having a chamfered annular outer edge region, in a selected deposition plane, during material deposition on the disc. The holder includes a pedestal and attached thereto, (i) a support defining a support edge adapted to contact a first point on an outer disc rim, and (ii) a pair of arms defining confronting gripping edges adapted to contact second and third points on opposite edge regions of the disc's outer rim. At least one of the arms is movable to allow three-point contact between the three holder edges and each of a group of discs whose outer diameters are within a defined diameter tolerance, and the edges are each formed of at least one groove, where the groove is dimensioned to receive and support a section of the disc edge portion within the groove, with adjacent non-chamfered regions of the disc disposed outside the groove.

Details of the gripping edge configurations and arm movement construction are as given above.

Figure 5:
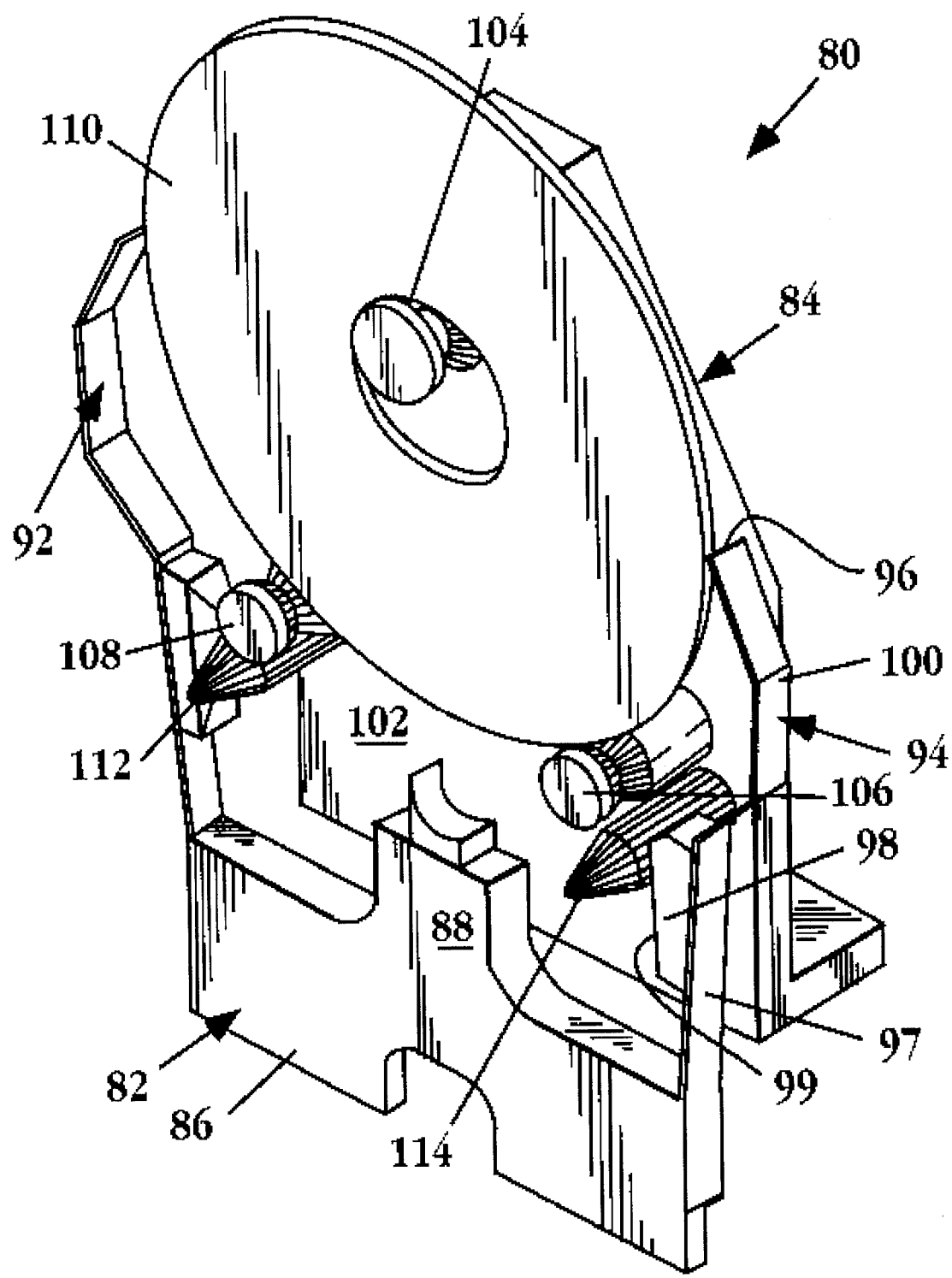
FIG. 5 shows a disc-transport carriage and a disc holder constructed according to a second embodiment of the invention.

FIG. 5 shows a disc-handling apparatus 80 constructed according to another embodiment of the invention. The apparatus generally includes a disc-holder 82 and a carriage 84. Holder 82 is mounted on a vertical track (not shown) for movement between a lower resting position and a raised sputtering position, similar to the movement of above-described holder 12. Similarly, carriage 84 is mounted on a horizontal track (not shown) for movement toward and away from a disc-transfer position at each end of the track, similar to the movement of above-described carriage 18.

Holder 82 includes a pedestal 86 having a center post 88 provided with a support 90, similar to support 30 in apparatus 10. Attached to opposite sides of the pedestal are arms 92, 94 which are formed of ribbons or spring metal which are shaped as shown to have inwardly facing distal gripping edges, such as edge 96. The arms are biased toward a relaxed condition, as seen best in FIG. 6A, and are movable, against the biasing in the arms, toward an open condition described below with respect to FIG. 6B.

Arm 94, which is representative, is formed of a lower cam member 97 carrying a cam structure 98 on an upper portion thereof, and an upper contact member 100. In the embodiment shown in FIG. 5, the two arm members are formed integrally from a single strip of flexible material, such as a spring metal strip, with the cam structure attached to the lower portion of this strip. In another embodiment, described below with respect to FIG. 7, the two arm members are joined through an insulative connection which serves to electrically insulate the arm's contact edge with the pedestal.

Carriage 84 has a construction similar to that of carriage 18, and includes a front plate 102 having a support button 104, and a pair of stabilizing buttons 106, 108 for supporting a disc, such as disc 110, in a stabilized supported position on the carriage.

Also carried on the support plate are pins 112, 114 with conical ends as shown. These pins are position to coact with the cam surfaces on arms 92, 94 to effect desired arm movement in engaging a disc, in a manner to be described.

FIGS. 6A–6C illustrate operation of the apparatus shown in FIG. 5. In this embodiment, the disc carriage and the disc holder start with the disc transfer in different planes. In operation, carriage 84 with disc 110 supported thereon is moved to a disc-transfer position adjacent disc holder 82, as seen in FIG. 6A. As the carriage approaches this position, and with the disc holder in its resting position, pins 112, 114, engage the cam surfaces of the associated holder arms, spreading the arms outwardly from their relaxed condition toward an open condition, as shown in FIG. 6B. In the open condition, the contact edges of the arms are positioned to accommodate movement of the disc into the plane containing the two arms, as illustrated.

At this stage, the disc holder is raised, wherein the action of the carriage pins against arms' cam surfaces causes inward arm movement, until the arm gripping edges make contact with opposite outer edge regions of the disc. As in apparatus 10, this occurs at about the same time the lower contact edge in the holder contacts a lower edge region on the disc. With continued upward travel of the disc holder, the pins disengage the arm cam surfaces, causing the arms to bend toward a condition in which the two gripping edges exert a radially inward force on opposite side regions of the disc, similar to the action of the gripping arms in apparatus 10.

With the disc now gripped by the holder, as shown in FIG. 6C, the holder is raised to lift the disc off the support button and the carriage can be retracted. The holder can then be raised to place the disc in a sputtering condition. As above, a reverse series of steps are effective to transfer the disc from the holder back to the carriage, for disc transfer to the next sputtering station.

Figure 7:
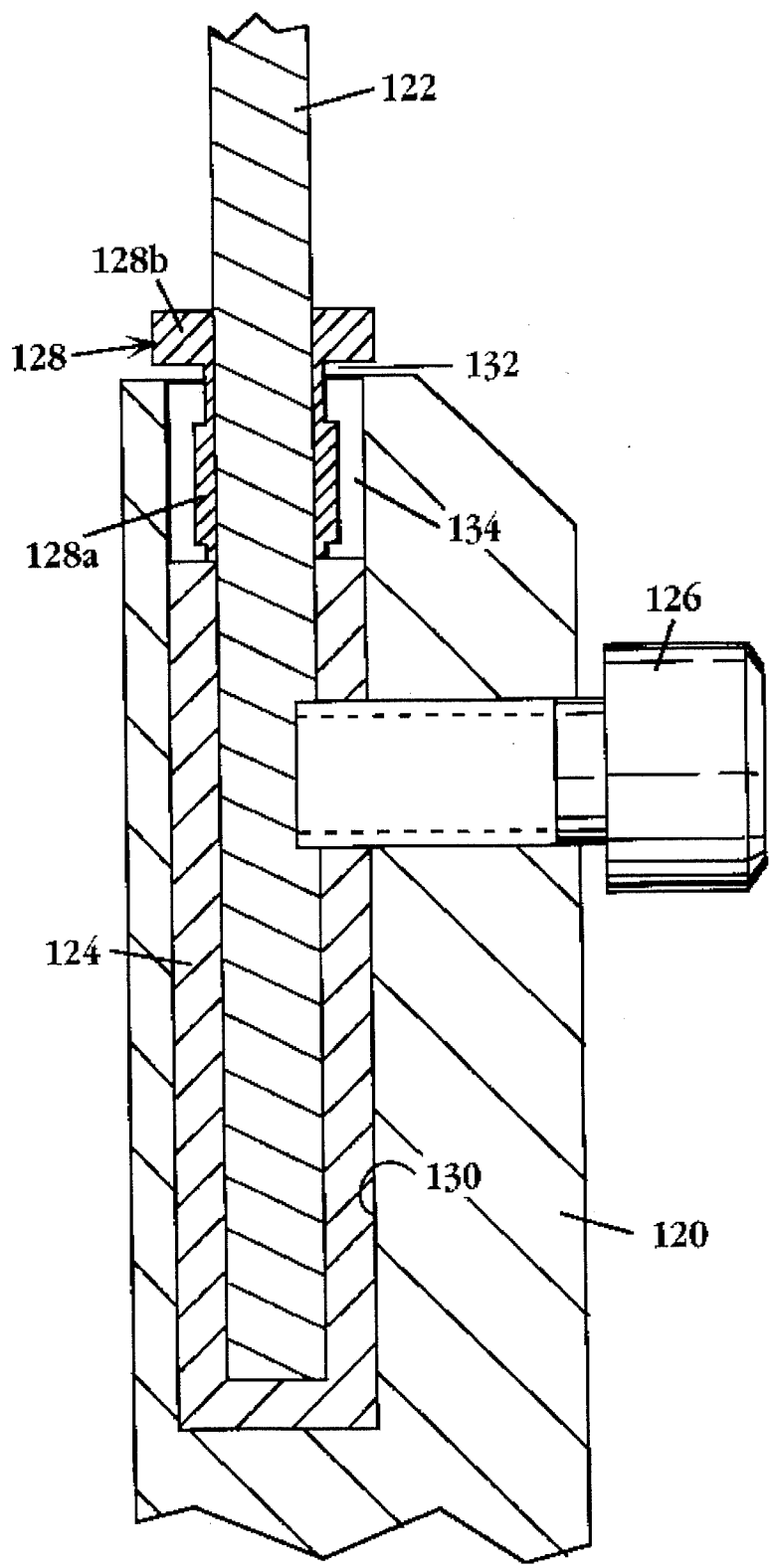
FIG. 7 shows, in enlarged cross-sectional view, the region of a gripper arm in an apparatus like that shown in FIGS. 6A–6C, illustrating the electrically insulative connection between the arm's lower cam member and upper contact member.

FIG. 7 shows, in enlarged cross-sectional view, a portion of a gripper arm in an apparatus like that shown in FIGS. 6A–6C. Seen here is an electrically conductive lower cam member 120, attached to the disc holder's pedestal (not seen in FIG. 7). An upper contact member 122, which terminates in a gripping edge as described above, is joined to cam member 120 through an insulative sleeve 124 which serves to electrically insulate the arm's contact edge with the pedestal. The arm members are further secured by a fastening means, such a screw 126, formed of a heat-resistant non-conductive material, such as TELFON™.

The arm further includes shielding means for preventing sputtered material from forming a continuous sputtered-material electrical connection between the two members. The shielding means includes a T-shaped sleeve-like structure 128 having a body portion 128a which is received over a portion of the contact member, immediately above sleeve 124, and a head portion 128b carried on the body portion above the cylindrical cavity in the cam member, here indicated at 130, in which the insulative sleeve is received.

As seen, the head portion forms a gap 132 between its lower surface and the upper end of cavity 130. This gap is dimensioned to limit deposition of sputtered material into an annular space 134 formed between the upper, inner wall of cavity 130, and the confronting surface portions of the shielding structure's body portion. That is, the gap is dimensioned, with respect to the mean free path of the sputtered material, to prevent sputtered material from reaching lower regions of space 134. At the same time, deposition of material on the upper surface of body portion 128a within space 134 reduces the tendency of the gap itself to fill completely with sputtered material and form a continuous electrically conductive bridge between the contact member and cam member. It will be understood that the arm has to be periodically removed and cleaned to remove the build up of deposition material in and around the insulative connection between cam member and contact member.

The T-shaped, sleeve-like structure, the space in which the structure sits, and the gap formed between the structure and the cam member are referred to herein as shielding means for preventing sputtered material from forming a continuous sputtered-material electrical connection between the cam member and the contact member.

In one embodiment of the invention, at least one of the edges, typically one of the arms' gripping edges, is electrically connected to the disc holder's pedestal, and the other two edges, e.g., the other arm edge and support edge, are electrically insulated from the pedestal. Thus, a single point of electrical contact is made between the disc and the holder, for use in applying a desired biasing voltage to a disc during sputtering.

From the foregoing, it can be seen how various objects and features of the disc handling apparatus are met. The operation of the apparatus is compatible with automated control of the positions of a disc holder and carriage to transfer a disc from carriage to holder and back to carriage.

When transferred to the disc holder, the disc is positively gripped at opposed side edges of the disc to hold the disc securely as it is moved into and out of a sputtering station, and during sputtering. The positive gripping action of the disc holder accommodates manufacturing variations in the edge configuration of discs and varying friction coefficients and thermal expansion coefficients of different disc materials. Also, because the disc is in constant contact with the gripping edges of the disc holder during sputter deposition in a sputtering station, there is reduced particulate contamination.

The positive gripping action of the arms allows the disc to be supported by contact edges having very shallow internal angles or shallow serrations, as described. This in turn significantly minimizes edge damage and shadowing effects during sputtering, and back-reflected sputtering effects when a bias is applied to the disc through the holder.

The latter advantages are demonstrated by the following tests which were performed to compare outer-track modulation characteristics in a thin-film medium sputtered in a conventional disc holder, and in a holder constructed according to the present invention.

In these tests, a thin-film medium having an aluminum substrate, Cr underlayer, Co-based magnetic thin film and carbon overcoat were prepared by successive layer sputtering on the substrate, using a conventional sputtering apparatus of the type having a vertically supported substrate held between a pair of sputter targets.

One substrate, identified as Leg3 in the table below, was supported on a conventional Varian substrate block designed to hold the substrate conventionally by three grooved edges. The other, identified as Leg1, was supported on and handled by apparatus constructed according to the present invention, where the contact edges in the disc holder have interior angles of about 160°. In both cases, the magnetic thin film layer was sputtered under conditions of a 500 volt bias applied to the substrate through the supporting pedestal.

The negative modulation (N-modulation) and positive-modulation (P-modulation) of outer track regions of each disc was measured conventionally. Specifically, N-modulation and P-modulation at several radii near the outer track edge, indicated in the table below, were measured. N-modulation provides a measure of the percentage reduction in bit storage capacity, and P-modulation, a measure of increased magnetic layer thickness, due in this instance to back-reflected sputtering in the region of the supporting-edge grooves.

The measured P-modulation and N-modulation values for the two sputtering conditions are given in the table below. As seen from the data, the disc formed using the apparatus of the invention is similar in its N- and P-modulation values at the 1.820 inch track radius, but significantly improved at the 1.830 and 1.840 tracks.

| Radius | LEG1 | (500V Bias) | LEG3 | (Control) |
|---|---|---|---|---|
| | | N-NOD | | |
| 1.820 | −14% | (side A) | −15% | (side A) |
| | −14% | (side B) | −18% | (side B) |
| 1.830 | −12% | (side A) | −18% | (side A) |
| | −15% | (side B) | −20% | (side B) |
| 1.840 | −19% | (side A) | −38% | (side A) |
| | −19% | (side B) | −38% | (side B) |
| 1.850 | <−40% | (side A) | <−40% | (side A) |
| | <−30% | (side B) | <−40% | (side B) |
| | | P-MOD | | |
| 1.820 | 15% | (side A) | 15% | (side A) |
| | 15% | (side B) | 19% | (side B) |
| 1.830 | 17% | (side A) | 21% | (side A) |
| | 17% | (side B) | 23% | (side B) |
| 1.840 | 23% | (side A) | 35% | (side A) |
| | 23% | (side B) | 37% | (side B) |
| 1.850 | >50% | (side A) | >100% | (side A) |
| | >50% | (side B) | >100% | (side B) |

Although the invention has been described with respect to particular embodiments, it will be apparent to those skilled in the art that various changes and modifications can be made without departing from the invention.

It is claimed:

1. Disc-handling apparatus for use in supporting a disc during deposition of sputtered material on the disc at a deposition station, and for transporting the disc into and out of such station, comprising a disc holder for supporting the disc in a selected deposition plane during material deposition, said holder having a pedestal and attached thereto (i) a support defining a support edge adapted to contact a first point on an outer disc rim, and (ii) a pair of arms defining confronting gripping edges adapted to contact second and third points on opposite edge regions of the disc's outer rim, said arms being relatively movable toward and away from a gripping condition at which the arms' confronting gripping edges are effective to contact, and apply radially inward forces on, opposite outer edge regions of the disc, with the arms in a biased condition, a disc transport carriage having means for supporting a disc on the carriage, means mounting said carriage for relative movement with respect to said holder in one direction toward and away from a disc-transfer site, means mounting said holder for relative movement with respect to said carriage in another direction toward and away from a resting position, and on said carriage means for moving said arms toward their gripping condition, as the holder is moved toward said disc-transfer site, away from its resting position, such that the gripping edges of the holder arms are brought into contact with, then biased against said opposite edge regions of the disc, as the holder's support edge makes contact with a lower edge region of the disc, to capture the disc in a positively gripped condition, with further movement of the holder away from its resting position being effective to disengage the disc from disc said supporting means.

2. The apparatus of claim 1, wherein the points of contact of said support and contact edges with a disc form a triangle that encompasses the center point of the disc.

3. The apparatus of claim 1, wherein said support and gripping edges are formed of a single, substantially V-shaped groove, with an interior angle of greater than about 125°.

4. The apparatus of claim 1, for use with a disc of the type having a chamfered annular outer edge region, and said gripper edges are each formed of at least one groove, where said groove is dimensioned to receive and support a section of such disc edge region within the groove, with adjacent non-chamfered regions of the disc disposed outside the groove.

5. The apparatus of claim 4, wherein said support and gripping edges are each formed of a single, substantially V-shaped groove, with an interior angle of greater than about 125°.

6. The apparatus of claim 4, wherein said support and gripping edges are substantially flat, serrated edges, each formed of a plurality of side-by-side grooves, and each groove is dimensioned to receive and support a section of such disc edge region within the groove, with adjacent non-chamfered regions of the disc disposed outside the groove.

7. The apparatus of claim 1, wherein said arms, in such gripping condition, are under spring tension, and such tension is effective to apply such radially inward forces on a disc, to hold the disc in its captured condition.

8. The apparatus of claim 7, wherein said moving means includes contact means on said carriage for engaging corresponding holder arms, and surface means on said arms in contact with said contact means causing the arms to move toward said gripping condition in response to relative movement of the holder away from its resting position.

9. The apparatus of claim 8, wherein said moving means is effective to move said arms from a relaxed condition to an open condition, when said carriage is moved to its disc-transfer site, with the holder in its resting position, and to move the arms from the open condition toward their gripping condition as the holder is moved away from its resting position.

10. The apparatus of claim 8, wherein said moving means is effective, with the carriage in its disc-transfer site and the holder in its resting position, to move said arms from a relaxed condition to an open condition, then from the open toward the gripping condition, as the holder is moved progressively away from its resting position.

11. The apparatus of claim 1, for use in supporting a disc in a substantially upright position during material deposition, wherein said carriage is movable in a substantially horizontal direction toward and away from the disc-transfer site, and the holder is movable in a substantially vertical direction toward and away from its resting position.

12. The apparatus of claim 1, wherein each of said arms is composed of an electrically conductive lower cam member and an electrically conductive upper contact member, and in one of said arms, (i) said contact member is attached to said cam member by an insulative sleeve, and (ii) said arm further includes shielding means for preventing sputtered material from forming a continuous sputtered-material electrical connection between said two members.

13. The apparatus of claim 12, wherein one of said edges is electrically connected to said pedestal, and the other two are electrically insulated therefrom.

14. A disc holder for supporting a planar disc of the type having a chamfered annular outer edge region, in a selected deposition plane, during deposition of sputtered material on the disc, comprising a support defining a support edge adapted to contact a first point on an outer disc rim, and a pair of arms defining confronting gripping edges adapted to contact second and third points on opposite edge regions of the disc's outer rim, at least one of said arms being movable by a movement actuation means on a disk transport means to allow three-point contact between the three holder edges and each of a group of discs whose outer diameters are within a defined diameter tolerance, and said edges are each formed of at least one groove, where said groove is dimensioned to receive and support a section of such disc edge portion within the groove, with adjacent non-chamfered regions of the disc disposed outside the groove.

15. The holder of claim 14, wherein said support and gripping edges are each formed of a single, substantially V-shaped groove, with an interior angle of greater than about 125°.

16. The holder of claim 14, wherein said support and gripping edges are substantially flat, serrated edges, each formed of a plurality of side-by-side grooves, and each groove is dimensioned to receive and support a section of such disc edge region within the groove, with adjacent non-chamfered regions of the disc disposed outside the groove.

17. The holder of claim 14, wherein said movable arm is spring biased to exert an inward force at the point of contact between the arm's edge and the edge region of a disc, when the disc is supported on the holder.

18. The holder of claim 14, wherein each of said arms is composed of an electrically conductive lower cam member and an electrically conductive upper contact member, and in one of said arms, (i) said contact member is attached to said cam member by an insulative sleeve, and (ii) said arm further includes shielding means for preventing sputtered material from forming a continuous sputtered-material electrical connection between said two members.

19. The holder of claim 18, wherein one of said edges is electrically connected to said pedestal, and the other two are electrically insulated therefrom.

* * * * *